(12) United States Patent
Ham et al.

(10) Patent No.: US 11,762,022 B2
(45) Date of Patent: Sep. 19, 2023

(54) ELECTRIC LEAKAGE DETECTION APPARATUS, ELECTRIC LEAKAGE DETECTION METHOD, AND ELECTRIC VEHICLE

(71) Applicant: LG Energy Solution, Ltd., Seoul (KR)

(72) Inventors: Sang-Hyeok Ham, Daejeon (KR); Jong-Wan Kim, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/631,914

(22) PCT Filed: Oct. 7, 2020

(86) PCT No.: PCT/KR2020/013691
§ 371 (c)(1),
(2) Date: Feb. 1, 2022

(87) PCT Pub. No.: WO2021/085885
PCT Pub. Date: May 6, 2021

(65) Prior Publication Data
US 2022/0283231 A1    Sep. 8, 2022

(30) Foreign Application Priority Data

Oct. 29, 2019 (KR) .................. 10-2019-0135660
Oct. 29, 2019 (KR) .................. 10-2019-0135661
Sep. 29, 2020 (KR) .................. 10-2020-0127292

(51) Int. Cl.
*G01R 31/36* (2020.01)
*G01R 31/3835* (2019.01)
(Continued)

(52) U.S. Cl.
CPC ........ *G01R 31/3648* (2013.01); *B60L 3/0069* (2013.01); *B60L 58/19* (2019.02); *G01R 31/3835* (2019.01)

(58) Field of Classification Search
CPC .................. G01R 31/3648; G01R 31/3835
(Continued)

(56) References Cited

U.S. PATENT DOCUMENTS 8,040,139 B2    10/2011  Plagens et al.
8,319,650 B2    11/2012  Volodymyr et al.
(Continued)

FOREIGN PATENT DOCUMENTS

CN         1719682 A    1/2006
CN       101779133 A    7/2010
(Continued)

OTHER PUBLICATIONS

International Search Report for PCTKR2020013691 dated Jan. 29, 2021, 2 pgs.
(Continued)

*Primary Examiner* — Ricky Go
(74) *Attorney, Agent, or Firm* — Lerner David LLP (57) ABSTRACT

An electric leakage detection apparatus for a battery included in an electric vehicle transmits a first voltage corresponding to a voltage between a negative terminal of the battery and a chassis of the electric vehicle to an analog-to-digital converter through a capacitor. The electric leakage detection apparatus transmits a second voltage corresponding to a voltage between a positive terminal of the battery and the chassis to the analog-to-digital converter through the capacitor. The analog-to-digital converter outputs digital signals indicating the first voltage and the second voltage using the negative terminal as the ground. The electric leakage detection apparatus determines the first voltage and the second voltage based on the digital signals, and detects an electric leakage between the battery and the chassis based on the first voltage and the second voltage.

15 Claims, 4 Drawing Sheets

(51) Int. Cl.
*B60L 58/19* (2019.01)
*B60L 3/00* (2019.01)

(58) Field of Classification Search
USPC .......................................................... 702/63
See application file for complete search history.

(56) References Cited

U.S. PATENT DOCUMENTS

| | | | |
|---|---|---|---|
| 8,421,466 B2 | 4/2013 | Kang et al. | |
| 9,919,666 B2* | 3/2018 | Kim | G01R 31/52 |
| 10,126,344 B2* | 11/2018 | Schulz | G01R 31/006 |
| 10,928,461 B1* | 2/2021 | Stafl | G01R 31/371 |
| 2006/0006840 A1 | 1/2006 | Furukawa | |
| 2007/0001684 A1 | 1/2007 | Kawamura | |
| 2010/0052419 A1 | 3/2010 | Oosawa et al. | |
| 2010/0207635 A1* | 8/2010 | Plagens | B60L 3/0023 |
| | | | 324/509 |
| 2010/0237872 A1 | 9/2010 | Kang et al. | |
| 2010/0259281 A1* | 10/2010 | Streit | G01R 31/3835 |
| | | | 324/600 |
| 2011/0199223 A1 | 8/2011 | Akimov et al. | |
| 2012/0146651 A1 | 6/2012 | Volodymyr et al. | |
| 2013/0099795 A1 | 4/2013 | Kamata et al. | |
| 2013/0285667 A1 | 10/2013 | Koduka et al. | |
| 2014/0159908 A1 | 6/2014 | Hong et al. | |
| 2015/0168497 A1 | 6/2015 | Tabatowski-Bush | |
| 2015/0175027 A1 | 6/2015 | Garcia-Flores | |
| 2016/0214484 A1 | 7/2016 | Gale et al. | |
| 2017/0113553 A1* | 4/2017 | Gale | G01R 31/52 |
| 2019/0011504 A1 | 1/2019 | Kim et al. | |
| 2019/0047436 A1 | 2/2019 | Song | |
| 2019/0152324 A1 | 5/2019 | Lee et al. | |
| 2020/0144812 A1 | 5/2020 | Shin | |
| 2021/0273269 A1* | 9/2021 | Zarabadi | G01R 31/52 |

FOREIGN PATENT DOCUMENTS

| | | |
|---|---|---|
| CN | 104220887 A | 12/2014 |
| CN | 104730313 A | 6/2015 |
| CN | 105823926 A | 8/2016 |
| CN | 108603903 A | 9/2018 |
| CN | 108713150 A | 10/2018 |
| JP | H06153301 A | 5/1994 |
| JP | 2004104923 A | 4/2004 |
| JP | 2008139249 A | 6/2008 |
| JP | 2010217146 A | 9/2010 |
| JP | 4874034 B2 | 2/2012 |
| JP | 2012137422 A | 7/2012 |
| JP | 4989205 B2 | 8/2012 |
| JP | 2012255784 A | 12/2012 |
| JP | 2013157282 A | 8/2013 |
| JP | 5334500 B2 | 11/2013 |
| JP | 5450144 B2 | 3/2014 |
| JP | 2014119421 A | 6/2014 |
| JP | 5767077 B2 | 8/2015 |
| JP | 2016045024 A | 4/2016 |
| JP | 2017133965 A | 8/2017 |
| JP | 2018048957 A | 3/2018 |
| KR | 20090015330 A | 2/2009 |
| KR | 20100027085 A | 3/2010 |
| KR | 101416816 B1 | 8/2014 |
| KR | 20150081988 A | 7/2015 |
| KR | 101610906 B1 | 4/2016 |
| KR | 101619328 B1 | 5/2016 |
| KR | 20190056554 A | 5/2019 |
| KR | 20190072272 A | 6/2019 |
| WO | 2019117556 A1 | 6/2019 |

OTHER PUBLICATIONS

Extended European Search Report including Written Opinion for Application No. 20881848.4 dated Sep. 6, 2022, pp. 1-7.

* cited by examiner

ELECTRIC LEAKAGE DETECTION APPARATUS, ELECTRIC LEAKAGE DETECTION METHOD, AND ELECTRIC VEHICLE

CROSS-REFERENCE TO RELATED APPLICATIONS

The present application is a national phase entry under 35 U.S.C. § 371 of International Application No. PCT/KR2020/013691 filed Oct. 7, 2020, published in Korean, which claims priority from Korean Patent Application No. 10-2019-0135660 filed in the Republic of Korea on Oct. 29, 2019, Korean Patent Application No. 10-2019-0135661 filed in the Republic of Korea on Oct. 29, 2019, and Korean Patent Application No. 10-2020-0127292 filed in the Republic of Korea on Sep. 29, 2020, all of which are incorporated herein by reference.

TECHNICAL FIELD

The present disclosure relates to technology for detection of electric leakage between a battery and chassis.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little of no memory effect, and thus they are gaining more attention than nickel-based batteries for their advantages that recharging can be done whenever it is convenient, the self-discharge rate is very low and the energy density is high.

Meanwhile, in some cases, the battery includes a single rechargeable cell, but in many cases, a plurality of batteries is connected in series and/or in parallel to supply high voltage.

The battery implemented to supply high voltage need to be kept in a fully electrically insulated state from the chassis of an electric vehicle. When insulation breakdown (i.e., an electric leakage) occurs between at least one of a positive terminal or a negative terminal of the battery and the chassis, a flow path of leakage currents is formed between the battery and the chassis, causing a failure or malfunction of an electric device connected to the battery, and especially, accidents such as electric shocks.

To detect the electric leakage of the battery, it is necessary to measure the voltage between at least two nodes electrically connected to the battery using a voltage detection means. The related art including Patent Literature 1 uses the chassis as the ground (an electrical location as the reference for voltage measurement) for sampling a voltage value required to determine the electric leakage. Accordingly, when instead of the chassis, the negative terminal of the battery is used as the ground, it is difficult to apply the technology of Patent Literature 1.

Meanwhile, the related art only detects the electric leakage of the battery, but cannot provide a user with information about which part of the battery is in a poor insulation state.

(Patent Literature 1) KR 10-2015-0081988 A (published on Jul. 15, 2015)

SUMMARY

Technical Problem

The present disclosure is designed to solve the above-described problem, and therefore the present disclosure is directed to providing an electric leakage detection apparatus using the negative terminal of a battery instead of the chassis as the ground for detecting voltage required for electric leakage detection, an electric leakage detection method and an electric vehicle comprising the electric leakage detection apparatus.

The present disclosure is further directed to providing an electric leakage detection apparatus for determining an electric leakage location in a battery when the electric leakage of the battery is detected, an electric leakage detection method and an electric vehicle comprising the electric leakage detection apparatus.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

An electric leakage detection apparatus for a battery included in an electric vehicle, according to a first embodiment of the present disclosure, includes a first switch connected between a first node connected to a negative terminal of the battery and a second node; a second switch connected between a third node connected to a positive terminal of the battery and a fourth node; a first resistor connected between a fifth node connected to a chassis of the electric vehicle and the second node; a second resistor connected between the fourth node and the fifth node; a capacitor connected between a sixth node and a seventh node; a first switching circuit configured to selectively connect the first resistor to the capacitor in parallel; a second switching circuit configured to selectively connect the second resistor to the capacitor in parallel; a third switching circuit provided to selectively connect the capacitor between the first node and an eighth node; an analog-to-digital converter (ADC) configured to generate a digital signal indicating a voltage between the first node and the eighth node; and a control unit operably coupled to the ADC. The control unit is configured to during a first period, execute a first switching mode for controlling the first switch to an ON state, the second switch to an OFF state, the first switching circuit to the ON state, the second switching circuit to the OFF state, and the third switching circuit to the OFF state. During a second period after the first period, the control unit is configured to execute a second switching mode for controlling the first switching circuit to the OFF state, the second switching circuit to the OFF state, and the third switching circuit to the ON state. The control unit is configured to determine a first voltage indicating a voltage of the first resistor, based on the digital signal generated by the analog-to-digital converter during the second period. The control unit is configured to during a third period, execute a third switching mode for controlling the first switch to the OFF state, the second switch to the ON state, the first switching circuit to the OFF state, the second switching circuit to the ON state, and the third switching circuit to the OFF state. During a fourth period after the third period, the control unit is configured to execute the second switching mode for controlling the first switching circuit to the OFF state, the second switching circuit to the OFF state, and the third switching circuit to the ON state. The control unit is configured to determine a second voltage indicating a voltage of the second resistor, based on the digital signal generated by the analog-to-digital converter during the fourth period. The control unit is configured to determine occurrence of an electric leakage between the battery and the chassis, based on the first voltage and the second voltage.

The first switching circuit includes a third switch connected between the second node and the sixth node; and a fourth switch connected between the fifth node and the seventh node. The second switching circuit includes a fifth switch connected between the fifth node and the sixth node; a sixth switch connected between the fourth node and the seventh node. The third switching circuit includes a seventh switch connected between the sixth node and the first node; and an eighth switch connected between the seventh node and the eighth node.

The electric leakage detection apparatus may further include a third resistor electrically connected in series to the first switch between the first node and the second node; and a fourth resistor electrically connected in series to the second switch between the third node and the fourth node.

A resistance of the first resistor may be equal to a resistance of the second resistor. A resistance of the third resistor may be equal to a resistance of the fourth resistor. The control unit may be configured to determine an insulation resistance indicating an insulation state between the battery and the chassis using:

$$R_{Leak} = \frac{V_{Batt} \times R_1}{V_1 + V_2} - (R_1 + R_3)$$

wherein $V_1$ is the first voltage, $V_2$ is the second voltage, $R_1$ is the resistance of the first resistor, $R_3$ is the resistance of the third resistor, $V_{Batt}$ is the voltage of the battery, and $R_{Leak}$ is the insulation resistance.

The control unit may be configured to determine occurrence of an electric leakage between the battery and the chassis in response to the insulation resistance being less than a predetermined threshold value.

The control unit may be configured to determine a diagnosis voltage indicating an electric leakage location between the battery and the chassis using:

$$V_A = \frac{V_1 \times V_{Batt}}{V_1 + V_2}$$

wherein $V_A$ is the diagnosis voltage.

An electric leakage detection apparatus for a battery included in an electric vehicle, according to a second embodiment of the present disclosure, includes a first switch connected between a first node connected to a negative terminal of the battery and a second node; a second switch connected between a third node connected to a positive terminal of the battery and a fourth node; a first resistor connected between a fifth node connected to a chassis of the electric vehicle and the second node; a second resistor connected between the fourth node and the fifth node; a first capacitor connected between a sixth node and a seventh node; a second capacitor connected between an eighth node and a ninth node; a first switching circuit provided to selectively connect the first resistor to the first capacitor in parallel; a second switching circuit provided to selectively connect the second resistor to the second capacitor in parallel; a third switching circuit provided to selectively connect the first capacitor between the first node and a tenth node; a fourth switching circuit provided to selectively connect the second capacitor between the first node and an eleventh node; an ADC configured to generate a first digital signal indicating a voltage between the first node and the tenth node and a second digital signal indicating a voltage between the first node and the eleventh node; and a control unit operably coupled to the ADC. The control unit is configured to during a first period, execute a first switching mode for controlling the first switch to an ON state, the second switch to an OFF state, the first switching circuit to the ON state, the second switching circuit to the OFF state, and the third switching circuit to the OFF state. During a second period after the first period, the control unit is configured to execute a second switching mode for controlling the first switching circuit to the OFF state and the third switching circuit to the ON state. The control unit is configured to determine a first voltage indicating a voltage of the first resistor, based on the first digital signal generated during the second period. The control unit is configured to during a third period, execute a third switching mode for controlling the first switch to the OFF state, the second switch to the ON state, the first switching circuit to the OFF state, the second switching circuit to the ON state, and the fourth switching circuit to the OFF state. During a fourth period after the third period, the control unit is configured to execute a fourth switching mode for controlling the second switching circuit to the OFF state and the fourth switching circuit to the ON state. The control unit is configured to determine a second voltage indicating a voltage of the second resistor, based on the second digital signal generated during the fourth period. The control unit is configured to determine occurrence an electric leakage between the battery and the chassis, based on the first voltage and the second voltage.

The first switching circuit includes a third switch electrically connected between the second node and the sixth node; and a fourth switch electrically connected between the fifth node and the seventh node. The second switching circuit includes a fifth switch electrically connected between the fifth node and the eighth node; and a sixth switch electrically connected between the fourth node and the ninth node. The third switching circuit includes a seventh switch electrically connected between the sixth node and the first node; and an eighth switch electrically connected between the seventh node and the tenth node. The fourth switching circuit includes a ninth switch electrically connected between the eighth node and the first node; and a tenth switch electrically connected between the ninth node and the eleventh node.

The electric leakage detection apparatus may further include a third resistor electrically connected in series to the first switch between the first node and the second node; and a fourth resistor electrically connected in series to the second switch between the third node and the fourth node.

A resistance of the first resistor may be equal to a resistance of the second resistor. A resistance of the third resistor may be equal to a resistance of the fourth resistor. The control unit may be configured to determine an insulation resistance indicating an insulation state between the battery and the chassis using:

$$R_{Leak} = \frac{V_{Batt} \times R_1}{V_1 + V_2} - (R_1 + R_3)$$

wherein $V_1$ is the first voltage, $V_2$ is the second voltage, $R_1$ is the resistance of the first resistor, $R_3$ is the resistance of the third resistor, $V_{Batt}$ is the voltage of the battery, and $R_{Leak}$ is the insulation resistance.

The control unit may be configured to determine occurrence of an electric leakage between the battery and the chassis in response to the insulation resistance being less than a predetermined threshold value.

The control unit may be configured to determine a diagnosis voltage indicating an electric leakage location between the battery and the chassis, using:

$$V_A = \frac{V_1 \times V_{Batt}}{V_1 + V_2}$$

wherein $V_A$ is the diagnosis voltage.

An electric vehicle according to another aspect of the present disclosure includes an electric leakage detection apparatus according to any of the embodiments described herein.

An electric leakage detection method which is executable by an electric leakage detection apparatus according to according to a first embodiment described herein, according to still another aspect of the present disclosure, includes during a first period, executing, by a control unit operably coupled to the ADC, a first switching mode for controlling the first switch to an ON state, the second switch to an OFF state, the first switching circuit to the ON state, the second switching circuit to the OFF state, and the third switching circuit to the OFF state; during a second period after the first period, executing, by the control unit, a second switching mode for controlling the first switching circuit to the OFF state, the second switching circuit to the OFF state, and the third switching circuit to the ON state; determining, by the control unit, a first voltage indicating a voltage of the first resistor at a first time point, based on the digital signal generated by the ADC at the first time point during the second period; during a third period, executing, by the control unit, a third switching mode for controlling the first switch to the OFF state, the second switch to the ON state, the first switching circuit to the OFF state, the second switching circuit to the ON state, and the third switching circuit to the OFF state; during a fourth period after the third period, executing, by the control unit, the second switching mode for controlling the first switching circuit to the OFF state, the second switching circuit to the OFF state, and the third switching circuit to the ON state; determining, by the control unit, a second voltage indicating a voltage of the second resistor at a second time point, based on the digital signal generated by the ADC at the second time point within the fourth period; and determining, by the control unit, occurrence of an electric leakage between the battery and the chassis, based on the first voltage and the second voltage.

Advantageous Effects

According to at least one of the embodiments of the present disclosure, it is possible to detect an electric leakage between a battery and a chassis using the negative terminal of the battery instead of the chassis as the ground for detecting voltage required for electric leakage detection.

In addition, according to at least one of the embodiments of the present disclosure, it is possible to determine an electric leakage location in a battery when the electric leakage of the battery is detected.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

Figure 1:
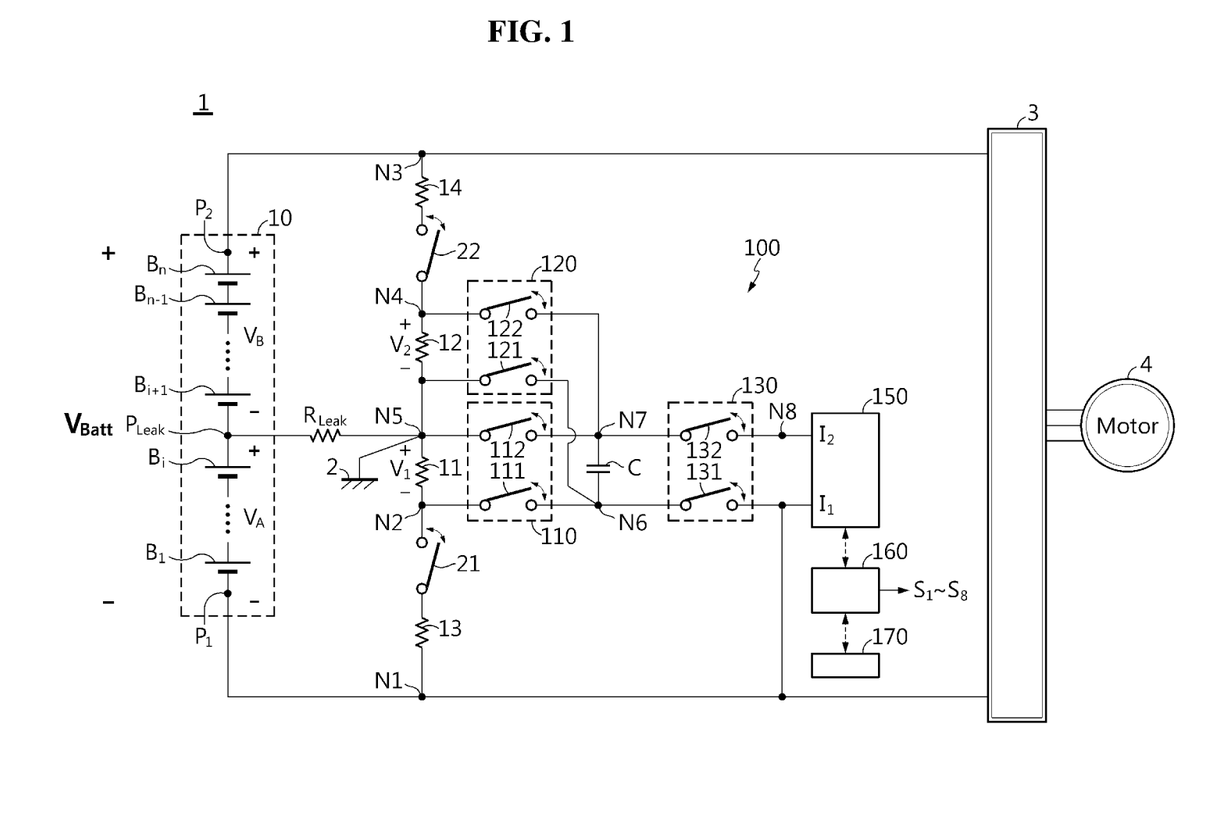
FIG. 1 is a diagram exemplarily showing a configuration of an electric vehicle including an electric leakage detection apparatus according to a first embodiment of the present disclosure.

FIG. 1 is a diagram exemplarily showing a configuration of an electric vehicle including an electric leakage detection apparatus according to a first embodiment of the present disclosure.

Referring to FIG. 1, the electric vehicle 1 includes a chassis 2, an inverter 3, an electric motor 4, a battery 10 and an electric leakage detection apparatus 100. For convenience of description, the illustration of a relay which opens and closes a power path between the battery 10 and the inverter 3 is omitted.

The inverter 3 is provided to convert direct current (DC) from the battery to alternating current (AC) in response to a command from the electric leakage detection apparatus 100. The electric motor 4 is a 3-phase AC motor, and operates with the AC produced by the inverter 3. The electric vehicle 1 travels by the driving power produced during the operation of the electric motor 4.

The battery 10 includes a plurality of battery cells $B_1 \sim B_n$ connected in series between a negative terminal $P_1$ and a positive terminal $P_2$. n is a natural number of 2 or greater. i is a natural number of $1 \sim (n-1)$. The plurality of battery cells $B_1 \sim B_n$ may include repeatedly rechargeable ones such as lithium ion cells, and is not limited to a particular type. When x and y are natural numbers and $1 \le x < y \le n$, the battery cell $B_x$ may be disposed at further downstream side than the battery cell $B_y$, and the battery cell $B_y$ may be disposed at further upstream side than the battery cell $B_x$. The negative terminal $P_1$ may be a negative terminal of the battery cell $B_1$. The positive terminal $P_2$ may be a positive terminal of the battery cell $B_n$.

The electric leakage detection apparatus 100 is provided to be electrically connected to the negative terminal $P_1$, the positive terminal $P_2$ and the chassis 2.

$R_{Leak}$ shown in FIG. 1 is virtual resistance (hereinafter referred to as 'insulation resistance') indicating how well the battery 10 is insulated from the chassis 2. While an electric leakage does not occur in the battery 10, the insulation resistance $R_{Leak}$ has a very large value beyond a predetermined threshold value. On the contrary, when a short circuit between a specific location (for example, '11', '12' or 'B') of the battery 10 and the chassis 2 is formed (i.e., when an electric leakage occurs in the battery 10) due to infiltration of moisture from the outside or water leakage in the battery 10, the insulation resistance $R_{Leak}$ will have a very small value that is equal to or less than the threshold value. Here, the threshold value may be a preset value to prevent an electric shock accident.

The electric leakage detection apparatus 100 includes first to eighth nodes N1, N2, N3, N4, N5, N6, N7, N8, a first resistor 11, a second resistor 12, a first switch 21, a second switch 22, a capacitor C, a first switching circuit 110, a second switching circuit 120, a third switching circuit 130, an analog-to-digital converter (ADC) 150 and a control unit 160. The electric leakage detection apparatus 100 may further include a third resistor 13 and a fourth resistor 14.

The first to eighth nodes N1~N8 may be part of a conductor such as a busbar or a wire for electrical connection between each component of the electric leakage detection apparatus 100, and the battery 10 and the chassis 2.

The first switch 21 is electrically connected between the first node N1 and the second node N2. The first node N1 has the same potential as the negative terminal $P_1$ of the battery 10. The third resistor 13 may be electrically connected in series to the first switch 21 between the first node N1 and the second node N2. That is, one end of the third resistor 13 and one end of the first switch 21 are connected in common, and any one of the other end of the third resistor 13 and the other end of the first switch 21 is electrically connected to the first node N1, and the other is electrically connected to the second node N2. The third resistor 13 is provided to prevent an inrush current when the first switch 21 is controlled to an ON state. While the first switch 21 is controlled to the ON state in response to a first switching signal $S_1$ from the control unit 160, the first node N1 is electrically connected to the fifth node N5 through the first switch 21, the third resistor 13 and the first resistor 11.

The second switch 22 is electrically connected between the third node N3 and the fourth node N4. The third node N3 has the same potential as the positive terminal of the battery 10. The fourth resistor 14 may be electrically connected in series to the second switch 22 between the third node N3 and the fourth node N4. That is, one end of the fourth resistor 14 and one end of the second switch 22 are connected in common, and any one of the other end of the fourth resistor 14 and the other end of the second switch 22 is electrically connected to the third node N3, and the other is electrically connected to the fourth node N4. The fourth resistor 14 is provided to prevent an inrush current when the second switch 22 is controlled to the ON state. The resistance of the third resistor 13 may be equal to the resistance of the fourth resistor 14. While the second switch 22 is controlled to the ON state in response to a second switching signal $S_2$ from the control unit 160, the third node N3 is electrically connected to the fifth node N5 through the second switch 22, the fourth resistor 14 and the second resistor 12.

The first resistor 11 is electrically connected between the second node N2 and the fifth node N5. The fifth node N5 is a node that is electrically connected to the chassis 2 of the electric vehicle 1 and has the same potential as the chassis 2.

The second resistor 12 is electrically connected between the fourth node N4 and the fifth node N5. That is, the first resistor 11 and the second resistor 12 are electrically connected in series through the fifth node N5 between the second node N2 and the fourth node N4.

The resistance of the first resistor 11 may be equal to the resistance of the second resistor 12. The resistance of the third resistor 13 may be a few to a few hundred times higher than the resistance of the first resistor 11.

The first switching circuit 110 is provided to selectively electrically connect the first resistor 11 to the capacitor C in parallel. The first switching circuit 110 may include a third switch 111 and a fourth switch 112. The third switch 111 is electrically connected between the second node N2 and the sixth node N6. The fourth switch 112 is electrically connected between the fifth node N5 and the seventh node N7. The first switching circuit 110 in the ON state indicates each of the third switch 111 and the fourth switch 112 in the ON state in response to a third switching signal $S_3$ and a fourth switching signal $S_4$. The first switching circuit 110 in an OFF state indicates at least one of the third switch 111 or the fourth switch 112 in an OFF state. While the first switching circuit 110 is in the ON state, the first resistor 11 is electrically connected in parallel to the capacitor C, so voltage equal to the voltage applied to the first resistor 11 is charged across the capacitor C.

The second switching circuit 120 is provided to selectively electrically connect the second resistor 12 to the capacitor C in parallel. The second switching circuit 120 may include a fifth switch 121 and a sixth switch 122. The fifth switch 121 is electrically connected between the fifth node N5 and the sixth node N6. The sixth switch 122 is electrically connected between the fourth node N4 and the seventh node N7. The second switching circuit 120 in the ON state indicates the fifth switch 121 and the sixth switch 122 in the ON state in response to a fifth switching signal $S_5$ and a sixth switching signal $S_6$ respectively. The second switching circuit 120 in the OFF state indicates at least one of the fifth switch 121 or the sixth switch 122 in the OFF state. While the second switching circuit 120 is in the ON state, the second resistor 12 is electrically connected in parallel to the capacitor C, so voltage equal to the voltage applied to the second resistor 12 is charged across the capacitor C.

The third switching circuit 130 is provided to selectively electrically connect the capacitor C between the first node N1 and the eighth node N8. The third switching circuit 130 may include a seventh switch 131 and an eighth switch 132. The seventh switch 131 is electrically connected between the sixth node N6 and the first node N1. The eighth switch 132 is electrically connected between the seventh node N7 and the eighth node N8. The third switching circuit 130 in the ON state indicates the seventh switch 131 and the eighth switch 132 in the ON state in response to a seventh switching signal $S_7$ and an eighth switching signal $S_8$ respectively. The third switching circuit 130 in the OFF state indicates at least one of the seventh switch 131 or the eighth switch 132 in the OFF state. While the third switching circuit 130 is in the ON state, the capacitor C is electrically connected in parallel between the first node N1 and the eighth node N8, so voltage that is equal to the voltage applied to the capacitor C is provided as input of the ADC 150.

The first switch 21, the second switch 22, the third switch 111, the fourth switch 112, the fifth switch 121, the sixth switch 122, the seventh switch 131 and the eighth switch 132 may be known switching devices such as Metal Oxide Semiconductor Field Effect Transistors (MOSFETs).

The ADC 150 is electrically connected to the first node N1 and the eighth node N8 through a pair of input terminals $I_1$, $I_2$. That is, one input terminal is electrically connected to the first node N1 and the other input terminal is electrically connected to the eighth node N8. The ADC 150 is configured to generate a digital signal indicating voltage between the first node N1 and the eighth node N8 provided as input voltage using the first node N1 having the same potential as the negative terminal $P_1$ as the ground.

The control unit 160 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions. The control unit 160 may include a memory embedded therein. The memory may store programs and data required for performing a method as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The control unit 160 is operably coupled to the inverter 3, the first switch 21, the second switch 22, the first switching circuit 110, the second switching circuit 120, the third switching circuit 130 and the ADC 150. The control unit 160 may selectively output each of the first to eighth switching signals $S_1$~$S_8$ to independently control the first switch 21, the second switch 22, the first switching circuit 110, the second switching circuit 120 and the third switching circuit 130. That is, each of the first switch 21, the second switch 22, the first switching circuit 110, the second switching circuit 120 and the third switching circuit 130 may be controlled to the ON or OFF state.

The value indicating the resistance of each of the first resistor 11, the second resistor 12, the third resistor 13 and the fourth resistor 14 is pre-stored in the memory.

While the first switch 21 has the ON state, a ratio of voltage of the first resistor 11 to voltage between the first node N1 and the fifth node N5 is equal to a ratio of resistance of the first resistor 11 to the sum of resistance of the first resistor 11 and the third resistor 13. For example, when the voltage between the first node N1 and the fifth node N5 is 200V, the resistance of the third resistor 13 is 5.98 MΩ and the resistance of the first resistor 11 is 0.02 MΩ, the voltage of the first resistor 11 is 200×0.02/(5.98+0.02) V.

While the second switch 22 has the ON state, a ratio of voltage of the second resistor 12 to voltage between the third node N3 and the fifth node N5 is equal to a ratio of resistance of the second resistor 12 to the sum of resistance of the second resistor 12 and the fourth resistor 14.

While the control unit 160 is executing a first switching mode, the control unit 160 controls the first switch 21 to the ON state, the second switch 22 to the OFF state, the first switching circuit 110 to the ON state, the second switching circuit 120 to the OFF state, and the third switching circuit 130 to the OFF state.

When the control unit 160 is executing a second switching mode, the control unit 160 controls the first switching circuit 110 to the OFF sate, the second switching circuit 120 to the OFF state, and the third switching circuit 130 to the ON state. In the second switching mode, the first switch 21 and the second switch 22 may be controlled to the OFF state.

When the control unit 160 is executing a third switching mode, the control unit 160 controls the first switch 21 to the OFF state, the second switch 22 to the ON state, the first switching circuit 110 to the OFF state, the second switching circuit 120 to the ON state, and the third switching circuit 130 to the OFF state.

The control unit 160 may execute the first switching mode during a first period, and then execute the second switching mode during a second period. The control unit 160 may determine a first voltage based on the digital signal generated by the ADC 150 at a first time point within the second period. The first voltage indicates voltage across the first resistor 11 at the first time point.

The control unit 160 may execute the third switching mode during a third period, and then execute the second switching mode during a fourth period. The control unit 160 may determine a second voltage based on the digital signal generated by the ADC 150 at a second time point within the fourth period. The second voltage indicates voltage across the second resistor 12 at the second time point.

Before or after determining the first voltage and the second voltage, the control unit 160 may determine the voltage of the battery 10 by executing a fourth switching mode during a fifth period and then executing the second switching mode during a sixth period.

When the control unit 160 executes the fourth switching mode, the control unit 160 controls the first switch 21 to the ON state, the second switch 22 to the ON state, the first switching circuit 110 to the ON state, the second switching circuit 120 to the OFF state, and the third switching circuit 130 to the OFF state. The control unit 160 may determine the voltage of the battery 10 based on the digital signal generated by the ADC 150 at a third time point within the sixth period. For example, the digital signal at the third time point indicates that the voltage of the capacitor C is 10V, and when the resistance of the first to fourth resistors 11, 12, 13, 14 is $R_1$, $R_1$, $R_3$, $R_3$ respectively, the voltage of the battery 10=$\{2(R_1+R_3)\}/R_1 \times 10$ V.

Alternatively, before or after determining the first voltage and the second voltage, the control unit 160 may measure the voltage of each of the plurality of battery cells $B_1 \sim B_n$ and the voltage (hereinafter referred to as '$V_{Batt}$') of the battery 10 using a voltage detection circuit (not shown, included in the electric leakage detection apparatus 100) electrically connected to each of the plurality of battery cells $B_1 \sim B_n$.

The time length of each of the first period, the second period, the third period, the fourth period, the fifth period and the sixth period may be preset. Additionally, a time difference between the start time of the earliest one of the first period, the second period, the third period, the fourth period, the fifth period and the sixth period and the end time of the last one may be equal to or smaller than a preset diagnostic execution time.

As shown in FIG. 1, assume that a connection point $P_{Leak}$ between the battery cell $B_i$ and the battery cell $B_{i+1}$ is electrically shorted to the chassis 2. The connection point $P_{Leak}$ may be an electric leakage location between the battery 10 and the chassis 2. The connection point $P_{Leak}$ between the battery cell $B_i$ and the battery cell $B_{i+1}$ is a connection point between the positive terminal of the battery cell $B_i$ and the negative terminal of the battery cell $B_{i+1}$.

When the voltage of the first resistor 11 is equal to the voltage of the capacitor C while the control unit 160 is executing the first switching mode, a closed loop circuit is formed by the connection point $P_{Leak}$, the insulation resistance $R_{Leak}$, the chassis 2, the first resistor 11, the first switch 21, the third resistor 13, the negative terminal $P_1$ and the battery cells $B_1 \sim B_n$.

The voltage across the first switch 21 is so low to be negligible. Accordingly, the voltage $V_A$ between the connection point $P_{Leak}$ and the negative terminal $P_1$, the insulation resistance $R_{Leak}$ and the first voltage have a relationship of the following Equation 1.

$$R_{Leak} = \frac{V_A \times R_1}{V_1} - (R_1 + R_3) \quad \text{[Equation 1]}$$

When the voltage of the second resistor 12 is equal to the voltage of the capacitor C while the control unit 160 is executing the third switching mode, a closed loop circuit is formed by the positive terminal $P_2$, the fourth resistor 14, the second switch 22, the second resistor 12, the chassis 2, the insulation resistance $R_{Leak}$, the connection point $P_{Leak}$ and the battery cells $B_{i+1} \sim B_1$.

The voltage across the second switch 22 is so low to be negligible. Accordingly, when the resistance of the first resistor 11 is equal to the resistance of the second resistor 12 and the resistance of the third resistor 13 is equal to the resistance of the fourth resistor 14, the voltage $V_B$ between the positive terminal $P_2$ and the connection point $P_{Leak}$, the insulation resistance $R_{Leak}$ and the second voltage have a relationship of the following Equation 2.

$$R_{Leak} = \frac{V_B \times R_1}{V_2} - (R_1 + R_3) \quad \text{[Equation 2]}$$

In Equations 1 and 2, $V_1$ is the first voltage, $V_2$ is the second voltage, $R_1$ is the resistance of the first resistor 11, and $R_3$ is the resistance of the third resistor 13.

In Equations 1 and 2, only $V_A$, $V_B$ and $R_{Leak}$ are unknown. When the voltage across the battery 10 is $V_{Batt}$, $V_{Batt}=V_A+V_B$. Accordingly, the following Equations 3 to 5 are derived from Equations 1 and 2.

$$R_{Leak} = \frac{V_{Batt} \times R_1}{V_1 + V_2} - (R_1 + R_3) \quad \text{[Equation 3]}$$

$$V_A = \frac{V_1 \times V_{Batt}}{V_1 + V_2} \quad \text{[Equation 4]}$$

$$V_B = \frac{V_2 \times V_{Batt}}{V_1 + V_2} \quad \text{[Equation 5]}$$

When the insulation resistance $R_{Leak}$ is less than the predetermined threshold value, the control unit 160 may determine that an electric leakage between the battery 10 and the chassis 2 occurred, and generate an electric leakage alarm signal.

In Equations 4 and 5, the voltage $V_A$ and the voltage $V_B$ indicate the electric leakage location of the battery 10 relative to the chassis 2, and may be referred to as 'a first diagnosis voltage' and 'a second diagnosis voltage' respectively.

When the first diagnosis voltage $V_A$ is equal to or higher than the sum of voltage of the first to $i^{th}$ battery cells $B_1 \sim B_n$ and less than the sum of voltage of the first to $i+1^{th}$ battery cells $B_1 \sim B_{i+1}$, the control unit 160 may determine the connection point $P_{Leak}$ between the battery cell $B_i$ and the battery cell $B_{i+1}$ as the electric leakage location.

When the second diagnosis voltage $V_B$ is equal to or higher than the sum of voltage of the $i+1^{th}$ to $n^{th}$ battery cells $B_{i+1} \sim B_n$ and less than the sum of voltage of the $i^{th}$ to $n^{th}$ battery cells $B_i \sim B_n$, the control unit 160 may determine the connection point $P_{Leak}$ between the battery cell $B_i$ and the battery cell $B_{i+1}$ as the electric leakage location.

When the first diagnosis voltage $V_A$ is 0V and the second diagnosis voltage $V_B$ is higher than 0V, the control unit 160 may determine the negative terminal $P_1$ as the electric leakage location. When the first diagnosis voltage $V_A$ is higher than 0V and the second diagnosis voltage $V_B$ is 0V, the control unit 160 may determine the positive terminal $P_2$ as the electric leakage location. When the first diagnosis voltage $V_A$ is 0V and the second diagnosis voltage $V_B$ is 0V, the control unit 160 may determine that the electric leakage detection apparatus 100 is faulty.

The electric leakage detection apparatus 100 may further includes an interface unit 170. The interface unit 170 may include at least one of a display or a speaker to output the electric leakage alarm signal from the control unit 160 into a signal in a format that can be recognized by a user. The electric leakage alarm signal may include information indicating the electric leakage location.

Figure 2:
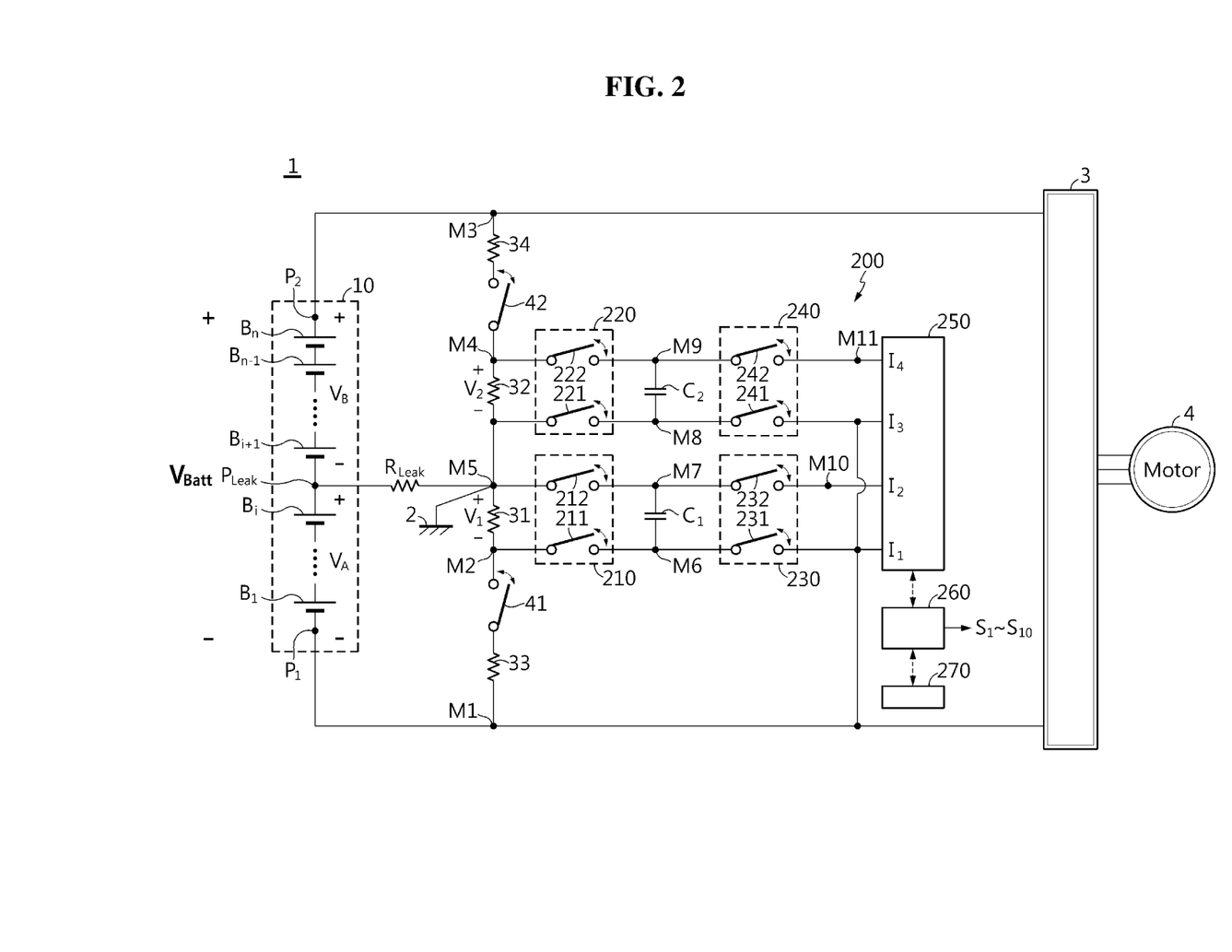
FIG. 2 is a diagram exemplarily showing a configuration of an electric vehicle including an electric leakage detection apparatus according to a second embodiment of the present disclosure.

FIG. 2 is a diagram exemplarily showing a configuration of an electric vehicle including an electric leakage detection apparatus according to a second embodiment of the present disclosure. The chassis 2, the inverter 3, the electric motor 4 and the battery 10 shown in FIG. 2 are the same as those described with reference to FIG. 1 and redundant descriptions are omitted herein.

The electric leakage detection apparatus 200 according to the second embodiment using two capacitors $C_1$, $C_2$ to measure voltage values $V_1$, $V_2$ required for electric leakage detection is different from the electric leakage detection apparatus 100 according to the first embodiment using a single capacitor C.

Referring to FIG. 2, the electric leakage detection apparatus 200 according to the second embodiment includes first to eleventh nodes M1, M2, M3, M4, M5, M6, M7, M8, M9, M10, M11, a first resistor 31, a second resistor 32, a first switch 41, a second switch 42, a first capacitor $C_1$, a second capacitor $C_2$, a first switching circuit 210, a second switching circuit 220, a third switching circuit 230, a fourth switching circuit 240, an ADC 250 and a control unit 260. The electric leakage detection apparatus 200 may further include a third resistor 33 and a fourth resistor 34.

The first to eleventh nodes M1-M11 may be part of a conductor such as a busbar or a wire for electrical connection between each component of the electric leakage detection apparatus 200, the battery 10 and the chassis 2.

The first switch 41 is electrically connected between the first node M1 and the second node M2. The first node M1 has the same potential as the negative terminal $P_1$ of the battery 10. The third resistor 33 may be electrically connected in series to the first switch 41 between the first node M1 and the second node M2. That is, one end of the third resistor 33 and one end of the first switch 41 are connected in common, and any one of the other end of the third resistor 33 and the other end of the first switch 41 is electrically connected to the first node M1 and the other is electrically connected to the second node M2. The third resistor 33 is provided to prevent an inrush current when the first switch 41 is controlled to the ON state. While the first switch 41 is controlled to the ON state in response to a first switching signal $S_1$ from the control unit 260, the first node M1 is electrically connected to the fifth node M5 through the first switch 41, the third resistor 33 and the first resistor 31.

The second switch 42 is electrically connected between the third node M3 and the fourth node M4. The third node M3 has the same potential as the positive terminal $P_2$ of the battery 10. The fourth resistor 34 may be electrically connected in series to the second switch 42 between the third node M3 and the fourth node M4. That is, one end of the fourth resistor 34 and one end of the second switch 42 are connected in common, and any one of the other end of the fourth resistor 34 and the other end of the second switch 42 is electrically connected to the third node M3 and the other is electrically connected to the fourth node M4. The fourth resistor 34 is provided to prevent an inrush current when the second switch 42 is controlled to the ON state. The resistance of the third resistor 33 may be equal to the resistance of the fourth resistor 34. While the second switch 42 is controlled to the ON state in response to a second switching signal $S_2$ from the control unit 260, the third node M3 is electrically connected to the fifth node M5 through the second switch 42, the fourth resistor 34 and the second resistor 32.

The first resistor 31 is electrically connected between the second node M2 and the fifth node M5. The fifth node M5 is a node that is electrically connected to the chassis 2 of the electric vehicle 1 and has the same potential as the chassis 2.

The second resistor 32 is electrically connected between the fourth node M4 and the fifth node M5. That is, the first resistor 31 and the second resistor 32 are electrically connected in series through the fifth node M5 between the second node M2 and the fourth node M4.

The resistance of the first resistor 31 may be equal to the resistance of the second resistor 32. The resistance of the third resistor 33 may be a few to a few hundred times higher than the resistance of the first resistor 31. The capacitance of the first capacitor $C_1$ may be equal to the capacitance of the second capacitor $C_2$.

The first switching circuit 210 is provided to selectively electrically connect the first resistor 31 to the first capacitor $C_1$ in parallel. The first switching circuit 210 may include a third switch 211 and a fourth switch 212. The third switch 211 is electrically connected between the second node M2 and the sixth node M6. The fourth switch 212 is electrically connected between the fifth node M5 and the seventh node M7. The first switching circuit 210 in the ON state indicates the third switch 211 and the fourth switch 212 in the ON state in response to a third switching signal $S_3$ and a fourth switching signal $S_4$ respectively. The first switching circuit 210 in the OFF state indicates at least one of the third switch 211 or the fourth switch 212 in the OFF state. While the first switching circuit 210 is in the ON state, the first resistor 31 is electrically connected in parallel to the first capacitor $C_1$, so voltage equal to the voltage applied to the first resistor 31 is charged across of the first capacitor $C_1$.

The second switching circuit 220 is provided to selectively electrically connect the second resistor 32 to the second capacitor $C_2$ in parallel. The second switching circuit 220 may include a fifth switch 221 and a sixth switch 222. The fifth switch 221 is electrically connected between the fifth node M5 and the eighth node M8. The sixth switch 222 is electrically connected between the fourth node M4 and the ninth node M9. The second switching circuit 220 in the ON state indicates the fifth switch 221 and the sixth switch 222 in the ON state in response to a fifth switching signal $S_5$ and a sixth switching signal $S_6$ respectively. The second switching circuit 220 in the OFF state indicates at least one of the fifth switch 221 or the sixth switch 222 in the OFF state. While the second switching circuit 220 is in the ON state, the second resistor 32 is electrically connected in parallel to the second capacitor $C_2$, so voltage equal to the voltage applied to the second resistor 32 is charged across the second capacitor $C_2$.

The third switching circuit 230 is provided to selectively electrically connect the first capacitor $C_1$ between the first node M1 and the tenth node M10. The third switching circuit 230 may include a seventh switch 231 and an eighth switch 232. The seventh switch 231 is electrically connected between the sixth node M6 and the first node M1. The eighth switch 232 is electrically connected between the seventh node M7 and the tenth node M10. The third switching circuit 230 in the ON state indicates the seventh switch 231 and the eighth switch 232 in the ON state in response to a seventh switching signal $S_7$ and an eighth switching signal $S_8$ respectively. The third switching circuit 230 in the OFF state indicates at least one of the seventh switch 231 or the eighth switch 232 in the OFF state. While the third switching circuit 230 is in the ON state, the first capacitor $C_1$ is electrically connected in parallel between the first node M1 and the tenth node M10, so voltage equal to the voltage applied to the first capacitor $C_1$ is provided to a first input of the ADC 250.

The fourth switching circuit 240 is provided to selectively electrically connect the second capacitor $C_2$ between the first node M1 and the eleventh node M11. The fourth switching circuit 240 may include a ninth switch 241 and a tenth switch 242. The ninth switch 241 is electrically connected between the eighth node M8 and the first node M1. The tenth switch 242 is electrically connected between the ninth node M9 and the eleventh node M11. The fourth switching circuit 240 in the ON state indicates the ninth switch 241 and the tenth switch 242 in the ON state in response to a ninth switching signal $S_9$ and a tenth switching signal $S_{10}$ respectively. The fourth switching circuit 240 in the OFF state indicates at least one of the ninth switch 241 or the tenth switch 242 in the OFF state. While the fourth switching circuit 240 is in the ON state, the second capacitor $C_2$) is electrically connected in parallel between the first node M1 and the eleventh node M11, so voltage equal to the voltage applied to the second capacitor $C_2$ is provided as a second input of the ADC 250.

The first switch 41, the second switch 42, the third switch 211, the fourth switch 212, the fifth switch 221, the sixth switch 222, the seventh switch 231, the eighth switch 232, the ninth switch 241 and the tenth switch 242 may be well-known switching devices such as Metal Oxide Semiconductor Field Effect Transistors ((MOSFETs).

The ADC 250 includes four input terminals $I_1$, $I_2$, $I_3$, $I_4$. Each of the input terminal $I_1$ and the input terminal $I_3$ is electrically connected to the first node M1, the input terminal $I_2$ is electrically connected to the tenth node M10, and the input terminal $I_4$ is electrically connected to the eleventh node M11. The ADC 250 is configured to selectively generate a first digital signal indicating the voltage between the first node M1 and the tenth node M10 provided as the first input and a second digital signal indicating the voltage between the first node M1 and the eleventh node M11 provided as the second input, using the first node M1 having the same potential as the negative terminal $P_1$ as the ground.

The control unit 260 may be configured substantially equally to the control unit 160 shown in FIG. 1. The control unit 260 is operably coupled to the inverter 3, the first switch 41, the second switch 42, the first switching circuit 210, the second switching circuit 220, the third switching circuit 230, the fourth switching circuit 240 and the ADC 250. The control unit 260 may selectively output each of the first to tenth switching signals $S_1$~$S_{10}$, to independently control the first switch 41, the second switch 42, the first switching circuit 210, the second switching circuit 220, the third switching circuit 230 and the fourth switching circuit 240. That is, each of the first switch 41, the second switch 42, the first switching circuit 210, the second switching circuit 220, the third switching circuit 230 and the fourth switching circuit 240 may be controlled to the ON state or the OFF state.

The value indicating the resistance of each of the first resistor 31, the second resistor 32, the third resistor 33 and the fourth resistor 34 may be pre-stored in the memory. The first resistor 31, the second resistor 32, the first resistor 11 and the second resistor 12 may have equal resistance. The third resistor 33, the fourth resistor 34, the third resistor 13 and the fourth resistor 14 may have equal resistance.

While the first switch 41 has the ON state, a ratio of voltage of the first resistor 31 to voltage between the first node M1 and the fifth node M5 is equal to a ratio of resistance of the first resistor 31 to the sum of resistance of the first resistor 31 and the third resistor 33.

While the second switch 42 has the ON state, a ratio of voltage of the second resistor 32 to voltage between the third node M3 and the fifth node M5 is equal to a ratio of resistance of the second resistor 32 to the sum of resistance of the second resistor 32 and the fourth resistor 34.

The first switching mode is a mode for charging the first capacitor $C_1$ with the voltage across the first resistor 31. When the control unit 260 executes the first switching mode, the control unit 260 controls the first switch 41 to the ON state, the second switch 42 to the OFF state, the first switching circuit 210 to the ON state, the second switching circuit 220 to the OFF state, and the third switching circuit 230 to the OFF state. When the control unit 260 executes the first switching mode, the control unit 260 may control the fourth switching circuit 240 to the ON or OFF state.

The second switching mode is a mode for detecting the voltage across the first capacitor $C_1$. When the control unit 260 executes the second switching mode, the control unit 260 controls the first switching circuit 210 to the OFF state and the third switching circuit 230 to the ON state. When the control unit 260 executes the second switching mode, the control unit 260 may control each of the first switch 41, the second switch 42, the second switching circuit 220 and the fourth switching circuit 240 to the ON or OFF state.

The third switching mode is a mode for charging the second capacitor $C_2$ with the voltage across the second resistor 32. When the control unit 260 executes the third switching mode, the control unit 260 controls the first switch 41 to the OFF state, the second switch 42 to the ON state, the first switching circuit 210 to the OFF state, the second switching circuit 220 to the ON state, and the fourth switching circuit 240 to the OFF state. When the control unit 260 executes the third switching mode, the control unit 260 may control the third switching circuit 230 to the ON or OFF state.

The fourth switching mode is a mode for detecting the voltage across the second capacitor $C_2$. When the control unit 260 executes the fourth switching mode, the control unit 260 controls the second switching circuit 220 to the OFF state and the fourth switching circuit 240 to the ON state. When the control unit 260 executes the fourth switching mode, the control unit 260 may control each of the first switch 41, the second switch 42, the first switching circuit 210 and the third switching circuit 230 to the ON or OFF state.

The control unit 260 may execute the first switching mode during the first period, and then execute the second switching mode during the second period. The control unit 260 may determine a first voltage based on the first digital signal generated by the ADC 250 at the first time point within the second period. The first voltage indicates voltage $V_1$ across the first resistor 31 at the first time point.

The control unit 260 may execute the third switching mode during the third period, and then execute the fourth switching mode during the fourth period. The control unit 260 may determine a second voltage based on the second digital signal generated by the ADC 250 at the second time point within the fourth period. The second voltage indicates voltage $V_2$ across the second resistor 32 at the second time point.

The four switching modes may be executed in the order of the first switching mode, the second switching mode, the third switching mode and the fourth switching mode. In this case, the second period and the third period may be equal or may overlap at least in part. While the voltage across the first capacitor $C_1$ is detected, the second capacitor $C_2$ may be charged with the voltage across the second resistor 32.

Alternatively, the four switching modes may be executed in the order of the third switching mode, the fourth switching mode, the first switching mode and the second switching mode. In this case, the fourth period and the first period may be equal or may overlap at least in part. While the voltage across the second capacitor $C_2$ is detected, the first capacitor $C_1$ may be charged with the voltage across the first resistor 31.

Before or after determining the first voltage and the second voltage, the control unit 260 may determine the voltage $V_{Batt}$ of the battery 10 by executing a fifth switching mode during the fifth period and then executing the second switching mode during the sixth period. When the control unit 260 executes the fifth switching mode, the control unit 260 controls the first switch 41 to the ON state, the second switch 42 to the ON state, the first switching circuit 210 to the ON state, the second switching circuit 220 to the OFF state, the third switching circuit 230 to the OFF state, and the fourth switching circuit 240 to the OFF state. The control unit 260 may determine the voltage $V_{Batt}$ of the battery 10 based on the first digital signal generated by the ADC 250 at the third time point within the sixth period.

Alternatively, before or after determining the first voltage and the second voltage, the control unit 260 may measure the voltage of each of the plurality of battery cells $B_1 \sim B_n$ and the voltage of the battery 10 using the voltage detection circuit (not shown, included in the electric leakage detection apparatus 200) electrically connected to each of the plurality of battery cells $B_1 \sim B_n$.

The time length of each of the first period, the second period, the third period, the fourth period, the fifth period and the sixth period may be preset. Additionally, a time difference between the start time of the earliest one of the first period, the second period, the third period, the fourth period, the fifth period and the sixth period and the end time of the last one may be equal to or smaller than the preset diagnostic execution time.

As shown in FIG. 2, assume that the connection point $P_{Leak}$ between the battery cell $B_i$ and the battery cell $B_{i+1}$ is electrically shorted to the chassis 2.

When the voltage of the first resistor 31 is equal to the voltage of the first capacitor $C_1$ while the control unit 260 is executing the first switching mode, a closed loop circuit is formed by the connection point $P_{Leak}$, the insulation resistance $R_{Leak}$, the chassis 2, the first resistor 31, the first switch 41, the third resistor 33, the negative terminal $P_1$ and the battery cells $B_1 \sim B_i$. Accordingly, the voltage $V_A$ between the connection point $P_{Leak}$ and the negative terminal $P_1$, the insulation resistance $R_{Leak}$ and the first voltage $V_1$ have a relationship of the above-described Equation 1.

When the voltage of the second resistor 32 is equal to the voltage of the second capacitor $C_2$ while the control unit 260 is executing the third switching mode, a closed loop circuit is formed by the positive terminal $P_2$, the fourth resistor 34, the second switch 42, the second resistor 32, the chassis 2, the insulation resistance $R_{Leak}$, the connection point $P_{Leak}$ and the battery cells $B_{i+1} \sim B_n$. Accordingly, when the resistance of each of the first resistor 31 and the second resistor 32 is $R_1$ and the resistance of each of the third resistor 33 and the fourth resistor 34 is $R_3$, the voltage $V_B$ between the positive terminal $P_2$ and the connection point $P_{Leak}$, the insulation resistance $R_{Leak}$ and the second voltage $V_2$ have a relationship of the above-described Equation 2. Accordingly, the above-described Equations 3 to 5 are also applied to the electric leakage detection apparatus 200 according to the second embodiment in common.

When the insulation resistance $R_{Leak}$ is less than the predetermined threshold value, the control unit 260 may determine that an electric leakage between the battery 10 and the chassis occurred, and generate an electric leakage alarm signal.

Hereinafter, an electric leakage detection method that may be performed by the electric leakage detection apparatus 100 according to the first embodiment and an electric leakage detection method that may be performed by the electric leakage detection apparatus 200 according to the second embodiment will be described. Each electric leakage detection method as described below will start in response to an occurrence of a predetermined event (for example, key-off of the electric vehicle 1).

Figure 3:
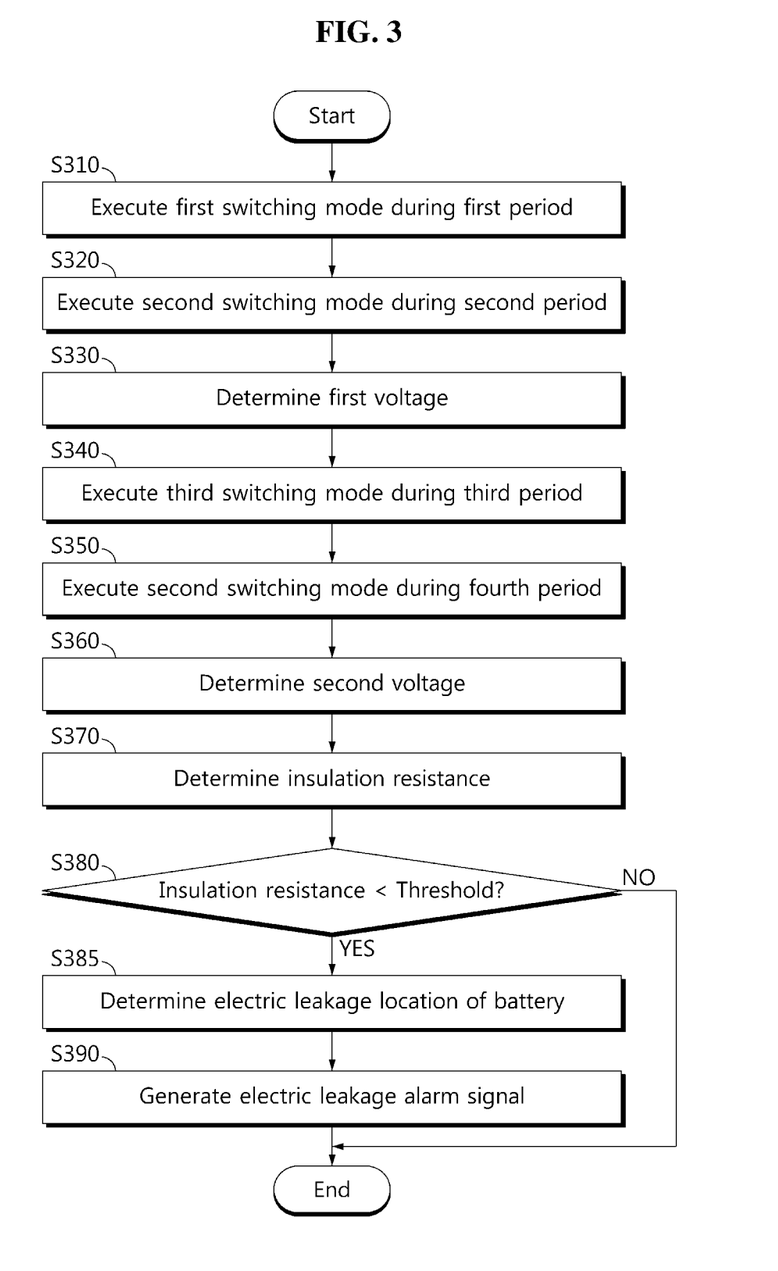
FIG. 3 is a flowchart exemplarily showing an electric leakage detection method that may be performed by the electric leakage detection apparatus according to the first embodiment as shown in FIG. 1.

FIG. 3 is a flowchart exemplarily showing the electric leakage detection method that may be performed by the electric leakage detection apparatus according to the first embodiment as shown in FIG. 1.

Referring to FIGS. 1 and 3, in step S310, the control unit 160 executes a first switching mode during a first period. Accordingly, during the first period, the capacitor C is charged with the voltage of the first resistor 11.

In step S320, the control unit 160 executes a second switching mode during a second period. Accordingly, during the second period, the capacitor C is electrically separated from the first switching circuit 110 and the second switching circuit 120 but is electrically connected between the first node N1 and the eighth node N8.

In step S330, the control unit 160 determines a first voltage $V_1$ based on the digital signal generated by the ADC 150 at the first time point within the second period.

In step S340, the control unit 160 executes a third switching mode during a third period. Accordingly, during the third period, the capacitor C is charged with the voltage of the second resistor 12.

In step S350, the control unit 160 executes the second switching mode during a fourth period. Accordingly, during the second period, the capacitor C is electrically separated from the first switching circuit 110 and the second switching circuit 120 but is electrically connected between the first node N1 and the eighth node N8.

In step S360, the control unit 160 determines a second voltage $V_2$ based on the digital signal generated by the ADC 150 at the second time point within the fourth period.

In step S370, the control unit 160 determines an insulation resistance $R_{Leak}$ indicating an insulation state (insulation breakdown) between the battery 10 and the chassis 2 based on the first voltage $V_1$ and the second voltage $V_2$ (see Equation 3).

In step S380, the control unit 160 determines whether the insulation resistance $R_{Leak}$ is less than the threshold. When a value of the step S380 is "Yes", step S385 may be performed.

In step S385, the control unit 160 determines an electric leakage location of the battery 10 relative to the chassis 2. That is, in the step S385, the control unit 160 determines at least one of the first diagnosis voltage $V_A$ or the second diagnosis voltage $V_B$ (see Equations 4 and 5), and determines whether the battery 10 is electrically disconnected from the chassis 2. The step S385 may be omitted from the method of FIG. 3. That is, when the value of the step S380 is "Yes", step S390 may be performed.

In step S390, the control unit 160 generates an electric leakage alarm signal. The electric leakage alarm signal includes information indicating the electric leakage location.

Figure 4:
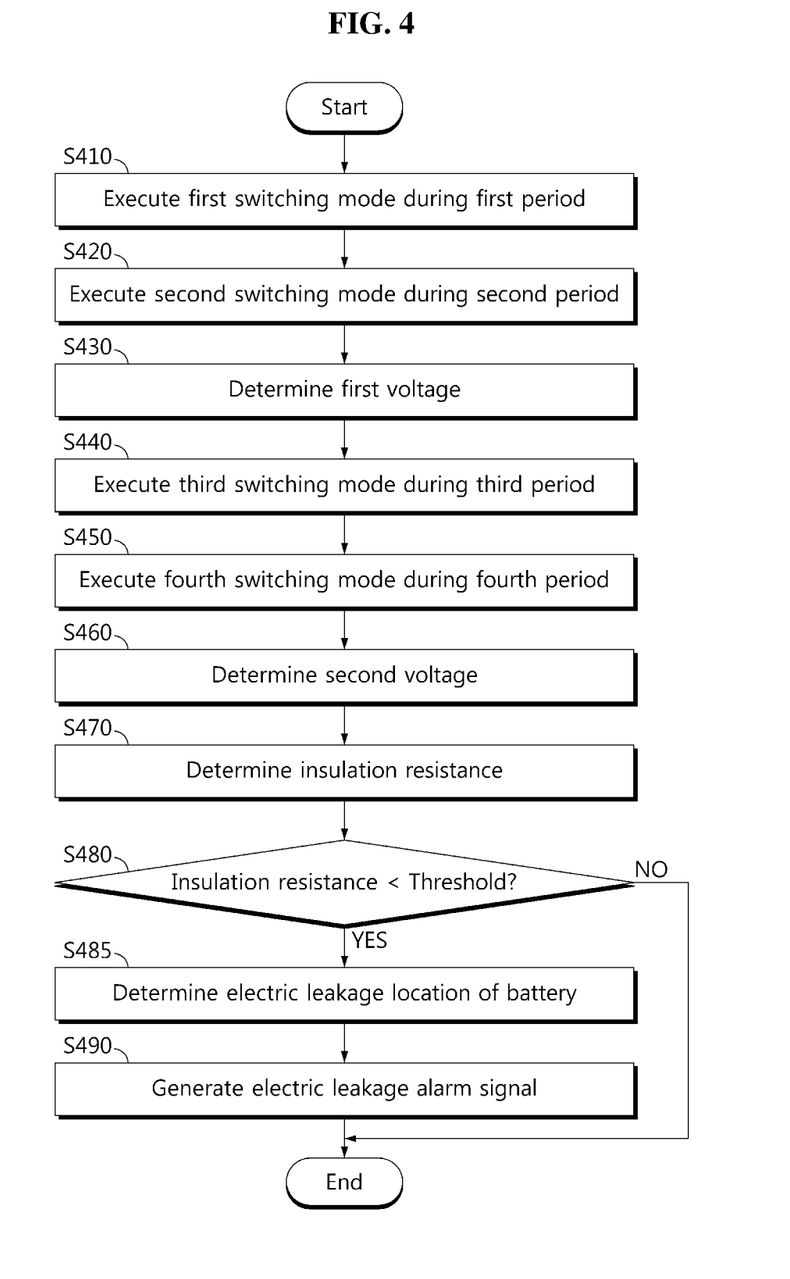
FIG. 4 is a flowchart exemplarily showing an electric leakage detection method that may be performed by the electric leakage detection apparatus according to the second embodiment as shown in FIG. 2.

FIG. 4 is a flowchart exemplarily showing the electric leakage detection method that may be performed by the electric leakage detection apparatus according to the second embodiment as shown in FIG. 2.

Referring to FIGS. 2 and 4, in step S410, the control unit 260 executes a first switching mode during a first period. Accordingly, during the first period, the first capacitor $C_1$ is charged with the voltage of the first resistor 31.

In step S420, the control unit 260 executes a second switching mode during a second period. Accordingly, during the second period, the first capacitor $C_1$ is electrically separated from the first switching circuit 210 but is electrically connected between the first node M1 and the tenth node M10.

In step S430, the control unit 260 determines a first voltage $V_1$ based on the first digital signal generated by the ADC 250 at the first time point within the second period.

In step S440, the control unit 260 executes a third switching mode during a third period. Accordingly, during the third period, the second capacitor $C_2$ is charged with the voltage of the second resistor 32. The step S440 may be performed at the same time as step S420 or S430.

In step S450, the control unit 260 executes a fourth switching mode during a fourth period. Accordingly, during the fourth period, the second capacitor $C_2$ is electrically separated from the second switching circuit 220, but is electrically connected between the first node M1 and the eleventh node M11.

In step S460, the control unit 260 determines a second voltage $V_2$ based on the second digital signal generated by the ADC 250 at the second point time within the fourth period.

In step S470, the control unit 260 determines an insulation resistance $R_{Leak}$ indicating an insulation state (insulation breakdown) between the battery 10 and the chassis 2 based on the first voltage $V_1$ and the second voltage $V_2$ (see Equation 3).

In step S480, the control unit 260 determines whether the insulation resistance $R_{Leak}$ is less than the threshold value. When a value of the step S480 is "Yes", step S485 may be performed.

In step S485, the control unit 260 determines an electric leakage location of the battery 10 relative to the chassis 2. That is, in the step S485, the control unit 260 determines at least one of the first diagnosis voltage $V_A$ or the second diagnosis voltage $V_B$ (see Equations 4 and 5), and determines a location within the battery 10 that is electrically disconnected from the chassis 2. The step S485 may be omitted from the method of FIG. 4. That is, when the value of the step S480 is "Yes", step S490 may be performed.

In step S490, the control unit 260 generates an electric leakage alarm signal.

Although FIGS. 3 and 4 show that the steps for determining the first voltage $V_1$ precede the steps for determining the second voltage $V_2$, the steps for determining the second voltage $V_2$ may precede the steps for determining the first voltage $V_1$. The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that a variety of modifications and changes may be made without departing from the technical aspect of the present disclosure and the equivalent scope of the appended claims.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. An electric leakage detection apparatus for a battery included in an electric vehicle, the electric leakage detection apparatus comprising:
    a first switch connected between a first node connected to a negative terminal of the battery and a second node;
    a second switch connected between a third node connected to a positive terminal of the battery and a fourth node;
    a first resistor connected between a fifth node connected to a chassis of the electric vehicle and the second node;
    a second resistor connected between the fourth node and the fifth node;
    a capacitor connected between a sixth node and a seventh node;
    a first switching circuit configured to selectively connect the first resistor to the capacitor in parallel;
    a second switching circuit configured to selectively connect the second resistor to the capacitor in parallel;
    a third switching circuit provided to selectively connect the capacitor between the first node and an eighth node;
    an analog-to-digital converter (ADC) configured to generate a digital signal indicating a voltage between the first node and the eighth node; and
    a control unit operably coupled to the ADC,
    wherein the control unit is configured to:
    during a first period, execute a first switching mode for controlling the first switch to an ON state, the second switch to an OFF state, the first switching circuit to the ON state, the second switching circuit to the OFF state, and the third switching circuit to the OFF state,
    during a second period after the first period, execute a second switching mode for controlling the first switching circuit to the OFF state, the second switching circuit to the OFF state, and the third switching circuit to the ON state,
    determine a first voltage indicating a voltage of the first resistor, based on the digital signal generated by the analog-to-digital converter during the second period,
    during a third period, execute a third switching mode for controlling the first switch to the OFF state, the second switch to the ON state, the first switching circuit to the OFF state, the second switching circuit to the ON state, and the third switching circuit to the OFF state,
    during a fourth period after the third period, execute the second switching mode for controlling the first switching circuit to the OFF state, the second switching circuit to the OFF state, and the third switching circuit to the ON state,
    determine a second voltage indicating a voltage of the second resistor, based on the digital signal generated by the analog-to-digital converter during the fourth period, and
    determine occurrence of an electric leakage between the battery and the chassis, based on the first voltage and the second voltage.

2. The electric leakage detection apparatus according to claim 1, wherein the first switching circuit includes:

a third switch connected between the second node and the sixth node; and
a fourth switch connected between the fifth node and the seventh node,
the second switching circuit includes:
a fifth switch connected between the fifth node and the sixth node; and
a sixth switch connected between the fourth node and the seventh node, and
the third switching circuit includes:
a seventh switch connected between the sixth node and the first node; and
an eighth switch connected between the seventh node and the eighth node.

3. The electric leakage detection apparatus according to claim 1, further comprising:
a third resistor electrically connected in series to the first switch between the first node and the second node; and
a fourth resistor electrically connected in series to the second switch between the third node and the fourth node.

4. The electric leakage detection apparatus according to claim 3, wherein a resistance of the first resistor is equal to a resistance of the second resistor, and
a resistance of the third resistor is equal to a resistance of the fourth resistor, and
wherein the control unit is configured to determine an insulation resistance indicating an insulation state between the battery and the chassis using:

$$R_{Leak} = \frac{V_{Batt} \times R_1}{V_1 + V_2} - (R_1 + R_3)$$

wherein $V_1$ is the first voltage, $V_2$ is the second voltage, $R_1$ is the resistance of the first resistor, $R_3$ is the resistance of the third resistor, $V_{Batt}$ is the voltage of the battery, and $R_{Leak}$ is the insulation resistance.

5. The electric leakage detection apparatus according to claim 4, wherein the control unit is configured to determine occurrence of an electric leakage between the battery and the chassis in response to the insulation resistance being less than a predetermined threshold value.

6. The electric leakage detection apparatus according to claim 4, wherein the control unit is configured to determine a diagnosis voltage indicating an electric leakage location between the battery and the chassis using:

$$V_A = \frac{V_1 \times V_{Batt}}{V_1 + V_2}$$

wherein $V_A$ is the diagnosis voltage.

7. An electric vehicle comprising the electric leakage detection apparatus according to claim 1.

8. An electric leakage detection apparatus for a battery included in an electric vehicle, the electric leakage detection apparatus comprising:
a first switch connected between a first node connected to a negative terminal of the battery and a second node;
a second switch connected between a third node connected to a positive terminal of the battery and a fourth node;
a first resistor connected between a fifth node connected to a chassis of the electric vehicle and the second node;
a second resistor connected between the fourth node and the fifth node;
a first capacitor connected between a sixth node and a seventh node;
a second capacitor connected between an eighth node and a ninth node;
a first switching circuit provided to selectively connect the first resistor to the first capacitor in parallel;
a second switching circuit provided to selectively connect the second resistor to the second capacitor in parallel;
a third switching circuit provided to selectively connect the first capacitor between the first node and a tenth node;
a fourth switching circuit provided to selectively connect the second capacitor between the first node and an eleventh node;
an analog-to-digital converter (ADC) configured to generate a first digital signal indicating a voltage between the first node and the tenth node and a second digital signal indicating a voltage between the first node and the eleventh node; and
a control unit operably coupled to the ADC,
wherein the control unit is configured to:
during a first period, execute a first switching mode for controlling the first switch to an ON state, the second switch to an OFF state, the first switching circuit to the ON state, the second switching circuit to the OFF state, and the third switching circuit to the OFF state,
during a second period after the first period, execute a second switching mode for controlling the first switching circuit to the OFF state and the third switching circuit to the ON state,
determine a first voltage indicating a voltage of the first resistor, based on the first digital signal generated during the second period,
during a third period, execute a third switching mode for controlling the first switch to the OFF state, the second switch to the ON state, the first switching circuit to the OFF state, the second switching circuit to the ON state, and the fourth switching circuit to the OFF state,
during a fourth period after the third period, execute a fourth switching mode for controlling the second switching circuit to the OFF state and the fourth switching circuit to the ON state,
determine a second voltage indicating a voltage of the second resistor, based on the second digital signal generated during the fourth period, and
determine occurrence of an electric leakage between the battery and the chassis, based on the first voltage and the second voltage.

9. The electric leakage detection apparatus according to claim 8, wherein the first switching circuit includes:
a third switch electrically connected between the second node and the sixth node; and
a fourth switch electrically connected between the fifth node and the seventh node,
the second switching circuit includes:
a fifth switch electrically connected between the fifth node and the eighth node; and
a sixth switch electrically connected between the fourth node and the ninth node,
the third switching circuit includes:
a seventh switch electrically connected between the sixth node and the first node; and
an eighth switch electrically connected between the seventh node and the tenth node, and the fourth switching circuit includes:
a ninth switch electrically connected between the eighth node and the first node; and
a tenth switch electrically connected between the ninth node and the eleventh node.

10. The electric leakage detection apparatus according to claim 8, further comprising:
a third resistor electrically connected in series to the first switch between the first node and the second node; and
a fourth resistor electrically connected in series to the second switch between the third node and the fourth node.

11. The electric leakage detection apparatus according to claim 10, wherein a resistance of the first resistor is equal to a resistance of the second resistor, and
a resistance of the third resistor is equal to a resistance of the fourth resistor,
wherein the control unit is configured to determine an insulation resistance indicating an insulation state between the battery and the chassis using:

$$R_{Leak} = \frac{V_{Batt} \times R_1}{V_1 + V_2} - (R_1 + R_3)$$

wherein $V_1$ is the first voltage, $V_2$ is the second voltage, $R_1$ is the resistance of the first resistor, $R_3$ is the resistance of the third resistor, $V_{Batt}$ is the voltage of the battery, and $R_{Leak}$ is the insulation resistance.

12. The electric leakage detection apparatus according to claim 11, wherein the control unit is configured to determine occurrence of an electric leakage between the battery and the chassis in response to the insulation resistance being less than a predetermined threshold value.

13. The electric leakage detection apparatus according to claim 11, wherein the control unit is configured to determine a diagnosis voltage indicating an electric leakage location between the battery and the chassis, using:

$$V_A = \frac{V_1 \times V_{Batt}}{V_1 + V_2}$$

wherein $V_A$ is the diagnosis voltage.

14. An electric vehicle comprising the electric leakage detection apparatus according to claim 7.

15. An electric leakage detection method which is executable by an electric leakage detection apparatus including a first switch connected between a first node connected to a negative terminal of a battery of an electric vehicle and a second node, a second switch connected between a third node connected to a positive terminal of the battery and a fourth node, a first resistor connected between a fifth node connected to a chassis of the electric vehicle and the second node, a second resistor connected between the fourth node and the fifth node, a capacitor connected between a sixth node and a seventh node, a first switching circuit configured to selectively connect the first resistor to the capacitor in parallel, a second switching circuit configured to selectively connect the second resistor to the capacitor in parallel, a third switching circuit provided to selectively connect the capacitor between the first node and an eighth node, and an ADC configured to generate a digital signal indicating a voltage between the first node and the eighth node, the electric leakage detection method comprising:

during a first period, executing, by a control unit operably coupled to the ADC, a first switching mode for controlling the first switch to an ON state, the second switch to an OFF state, the first switching circuit to the ON state, the second switching circuit to the OFF state, and the third switching circuit to the OFF state;

during a second period after the first period, executing, by the control unit, a second switching mode for controlling the first switching circuit to the OFF state, the second switching circuit to the OFF state, and the third switching circuit to the ON state;

determining, by the control unit, a first voltage indicating a voltage of the first resistor at a first time point, based on the digital signal generated by the ADC at the first time point during the second period;

during a third period, executing, by the control unit, a third switching mode for controlling the first switch to the OFF state, the second switch to the ON state, the first switching circuit to the OFF state, the second switching circuit to the ON state, and the third switching circuit to the OFF state;

during a fourth period after the third period, executing, by the control unit, the second switching mode for controlling the first switching circuit to the OFF state, the second switching circuit to the OFF state, and the third switching circuit to the ON state;

determining, by the control unit, a second voltage indicating a voltage of the second resistor at a second time point, based on the digital signal generated by the ADC at the second time point within the fourth period; and determining, by the control unit, occurrence of an electric leakage between the battery and the chassis, based on the first voltage and the second voltage.

* * * * *